(12) United States Patent
Iwasaki (10) Patent No.: US 11,714,335 B2
(45) Date of Patent: Aug. 1, 2023

(54) ELECTRONIC DEVICE

(71) Applicant: CANON KABUSHIKI KAISHA, Tokyo (JP)

(72) Inventor: Shogo Iwasaki, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/721,487

(22) Filed: Apr. 15, 2022

(65) Prior Publication Data

US 2022/0342280 A1 Oct. 27, 2022

(30) Foreign Application Priority Data

Apr. 21, 2021 (JP) ................................. 2021-071654

(51) Int. Cl.
| | | |
|---|---|---|
| *H05K 5/06* | (2006.01) | |
| *G03B 17/08* | (2021.01) | |

(52) U.S. Cl.
CPC ............. *G03B 17/08* (2013.01); *H05K 5/063* (2013.01)

(58) Field of Classification Search
CPC ....................................................... H05K 5/00
See application file for complete search history.

(56) References Cited

U.S. PATENT DOCUMENTS

| | | | | |
|---|---|---|---|---|
| 6,456,498 B1 * | 9/2002 | Larson | ................... | G06F 1/184 361/752 |
| 7,237,854 B2 * | 7/2007 | Chen | ...................... | G06F 1/187 312/223.2 |

FOREIGN PATENT DOCUMENTS

JP 09-67456 A 3/1997

* cited by examiner

*Primary Examiner* — Jerry Wu
(74) *Attorney, Agent, or Firm* — Cowan, Liebowitz & Latman, P.C.

(57) ABSTRACT

An electronic device includes a body frame formed by mating first to third members. The first and second members each include first to third mating surfaces. The first and second mating surfaces face corresponding surfaces in a first direction and the third mating surfaces face each other in a second direction orthogonal to the first direction. The first to third members each include fourth to sixth mating surfaces. Between the first and second members and the third member, the fourth and fifth mating surfaces face corresponding surfaces in a third direction orthogonal to the first and second directions, and the sixth mating surfaces face each other in the second direction. Microstructures for a liquid repellency are provided on at least one of the first to third mating surfaces and at least one of the fourth to sixth mating surfaces.

8 Claims, 13 Drawing Sheets

ELECTRONIC DEVICE

BACKGROUND OF THE INVENTION

Field of the Invention

The present disclosure relates to an electronic device, particularly to a drip-proof structure of the electronic device.

Description of the Related Art

Many portable electronic devices are required to be drip-proof (waterproof). In particular, electronic devices in each of which a body frame is formed by three or more members are required to ensure waterproof performance without increasing their sizes and impairing portability. Japanese Patent Laid-Open No. ("JP") H09-67456 discloses a waterproof structure in which liquid-repellent coatings of polytetrafluoroethylene or the like are formed on butt end surfaces of two members.

However, according to JP H09-67456, the waterproof structure requires preparation of material of the liquid-repellent coatings in addition to material of each member to be butted. Further, JP H09-67456 does not disclose a waterproof structure for a mating part of three members.

SUMMARY OF THE INVENTION

The present disclosure provides an electronic device that can ensure good liquid-repellent performance at a mating part of three members without using material in addition to each member.

An electronic device according to one aspect of embodiments of the disclosure includes a body frame formed by mating a first member, a second member, and a third member. Each of the first and second members includes a first mating surface and a second mating surface one of which is provided on an outer surface side and the other of which is provided on an inner surface side, the first and second mating surfaces being stepped surfaces, and a third mating surface connected to the first and second mating surfaces. The first and second members are mated to each other so that the first mating surfaces face each other in a first direction, the second mating surfaces face each other in the first direction, and the third mating surfaces face each other in a second direction orthogonal to the first direction. Each of the first, second, and third members includes a fourth mating surface and a fifth mating surface one of which is provided on the outer surface side and the other of which is provided on the inner surface side, the fourth and fifth mating surfaces being stepped surfaces and a sixth mating surface connected to the fourth and fifth mating surfaces. The first and third members and the second and third members are respectively mated to each other so that the fourth mating surfaces face each other in a third direction orthogonal to the first and second directions, the fifth mating surfaces face each other in the third direction, and the sixth mating surfaces face each other in the second direction. A microstructure is provided on each of (a) at least one mating surface of the first to third mating surfaces of at least one member of the first and second members and (b) at least one mating surface of the fourth to sixth mating surfaces of at least one member of the first to third members, the microstructure being molded so that a surface provided with the microstructure has a liquid repellency.

Further features of the present invention will become apparent from the following description of exemplary embodiments with reference to the attached drawings.

DESCRIPTION OF THE EMBODIMENTS

Referring now to the accompanying drawings, a description will be given of embodiments according to the present disclosure.

First Embodiment

Figure 1A:
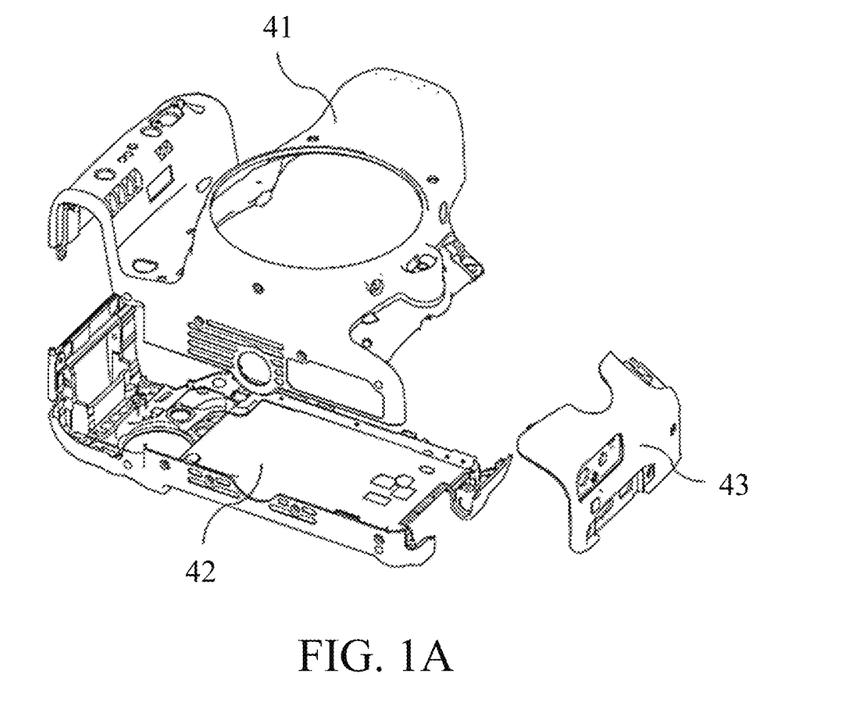
FIGS. 1A and 1B are exploded perspective views illustrating a body frame of an image pickup apparatus according to an embodiment.
Figure 1B:
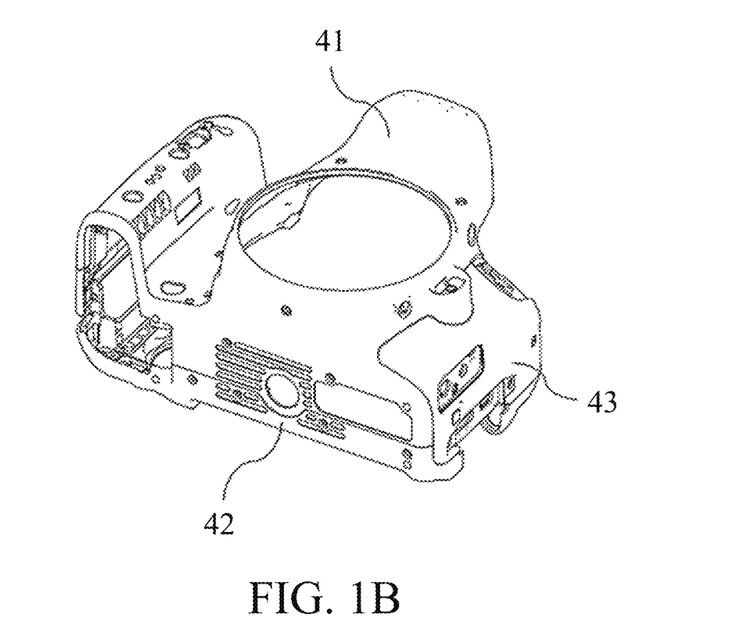

FIG. 1A illustrates an exploded state of a body frame 100 of an image pickup apparatus (camera) as an electronic device according to a first embodiment of the present disclosure, and FIG. 1B illustrates an assembled state of the body frame 100. The body frame 100 is assembled by mating three exterior members including a front cover member 41, a rear cover member 42, and a side cover member 43. The front cover member 41, the rear cover member 42, and the side cover member 43 respectively correspond to the first member 1, the second member 2, and the third member 3 included in a body frame model that models the body frame 100 as illustrated in FIG. 2.

Figure 2:
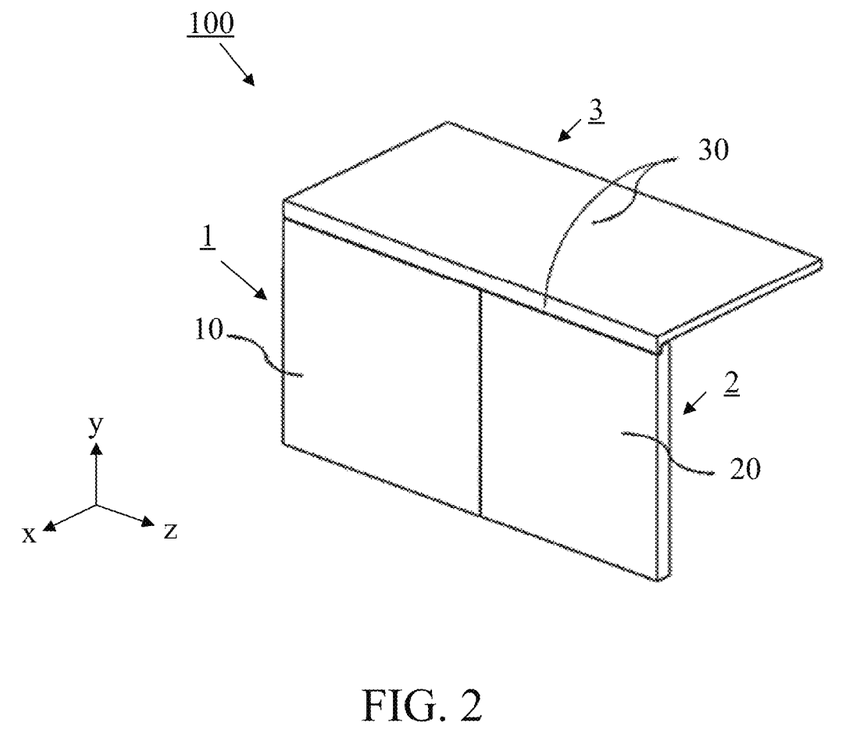
FIG. 2 is a perspective view illustrating a body frame model modeling the body frame.

In FIG. 2, the first member 1 and the second member 2 respectively have exterior surfaces (outer surfaces) 10 and 20 that are yz surfaces, and their end portions in a z direction facing each other are mated. The third member 3 has an exterior surface 30 having an xz surface and a yz surface that is orthogonal to the xz surface, and an end in an x direction of the third member 3 is mated with ends in a y direction of the first member 1 and the second member 2. The exterior surfaces 10, 20, and 30 are treated with coating processing or textural processing as exterior surface processing.

Figure 3A:
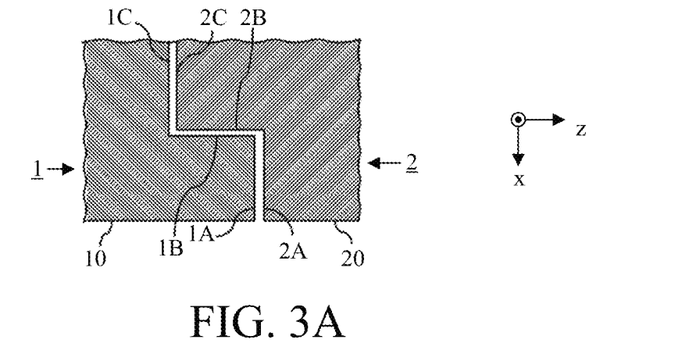
FIGS. 3A and 3C are sectional views of the body frame model.
Figure 3B:
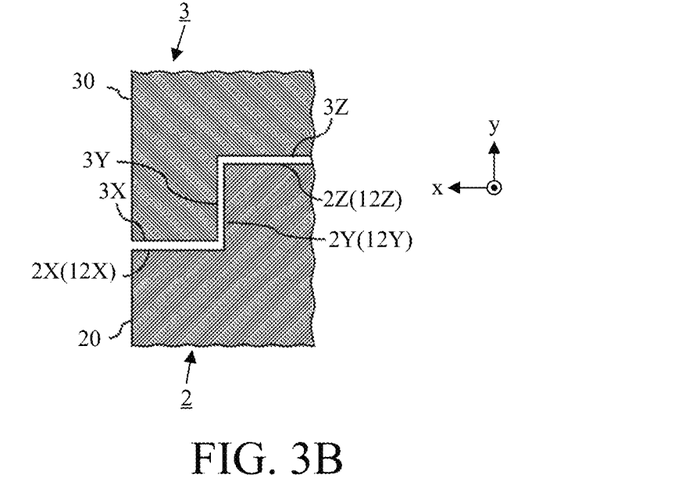
Figure 3C:
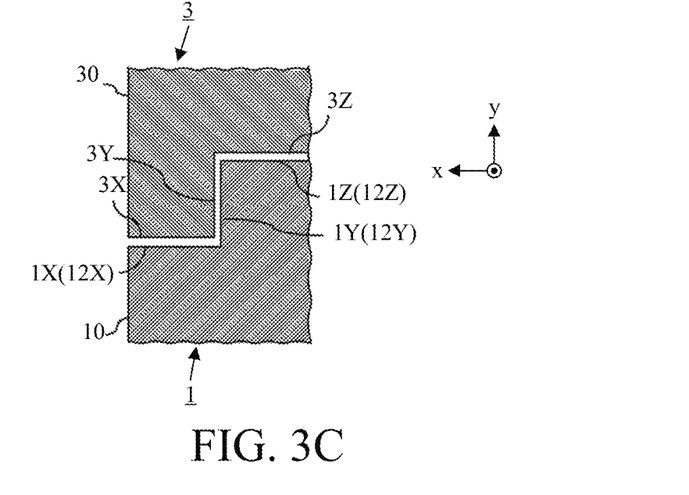

FIG. 3A is a section of a mating part in the z direction of the first member 1 and the second member 2, as viewed from the y direction. FIGS. 3B and 3C are respective sections of a mating part in the y direction of the second member 2 and the third member 3 and a mating part in the y direction of the first member 1 and third member 3, as viewed from the z direction. As illustrated in FIGS. 3A to 3C, each of the mating parts of the first to third members 1 to 3 has a step shape in which a step is formed in their mating direction (surfaces are stepped surfaces).

In the mating part with the second member 2, the first member 1 has mating surfaces 1A and 1C as xy surfaces and a mating surface 1B as a yz surface provided between the mating surfaces 1A and 1C. In the mating part with the third member 3, the first member 1 has mating surfaces 1X and 1Z as xz surfaces and a mating surface 1Y as a yz surface provided between the mating surfaces 1X and 1Z. In the first member 1, the mating surfaces 1A and 1C respectively correspond to a first mating surface and a second mating surface one of which is provided on an outer surface side and the other of which is provided on an inner surface side, the first and second mating surfaces being stepped surfaces. The mating surface 1B corresponds to a third mating surface orthogonally connected to the mating surfaces 1A and 1C.

In the mating part with the first member 1, the second member 2 has mating surfaces 2A and 2C as xy surfaces and a mating surface 2B as a yz surface between the mating surfaces 2A and 2C. In the mating part with the third member 3, the second member 2 has mating surfaces 2X and 2Z as xz surfaces and a mating surface 2Y as a yz surface between the mating surfaces 2X and 2Z. In the second member 2, the mating surfaces 2A and 2C respectively correspond to a first mating surface and a second mating surface one of which is provided on an outer surface side and the other of which is provided on an inner surface side, the first and second mating surfaces being stepped surfaces. The mating surface 2B corresponds to a third mating surface orthogonally connected to the mating surfaces 2A and 2C.

In the mating parts with the first and second members 1 and 2, the third member 3 has mating surfaces 3X and 3Z as xz surfaces and a mating surface 3Y as a yz surface between the mating surfaces 3X and 3Z. In the third member 3, the mating surfaces 3X and 3Z respectively correspond to a fourth mating surface and a fifth mating surface one of which is provided on an outer surface side and the other of which is provided on an inner surface side (inner side), the fourth and fifth mating surfaces being stepped surfaces. The mating surface 3Y corresponds to a sixth mating surface orthogonally connected to the mating surfaces 3X and 3Z.

The first and second members 1 and 2 are mated to each other so that the mating surfaces 1A, 1B, and 1C and the mating surfaces 2A, 2B, and 2C (that is, the respective corresponding mating surfaces) respectively face each other with predetermined clearances (gap) between them. As a result, the mating surfaces 1X and 2X, the mating surfaces 1Y and 2Y, and the mating surfaces 1Z and 2Z become continuous surfaces with the clearances between them. In FIGS. 3B and 3C, these continuous mating surfaces are also indicated as 12X, 12Y, and 12Z in parentheses. The first and second members 1 and 2 and the third member 3 are mated so that the mating surfaces 12X, 12Y, and 12Z and the mating surfaces 3X, 3Y, and 3Z respectively face each other with predetermined clearances between them.

The step shapes of the mating parts illustrated in FIGS. 3A to 3C are mere examples, and other step shapes may be formed. For example, according to FIGS. 3B and 3C, in the mating parts, the third member 3 has the step shape in which a part on an outer side (exterior surface side) is convex downward and a part on an inner side is concave upward, and each of the first and second members 1 and 2 has the step shape in which a part on the outer side is concave downward and a part on the inner side is convex upward. However, the step shapes in the mating parts may be such that the third member 3 has a step shape in which the part on the outer side is concave upward and the part on the inner side is convex downward and each of the first and second members 1 and 2 has a step shape in which the part on the outer side is convex upward and the part on the inner side is concave downward.

Figure 4:
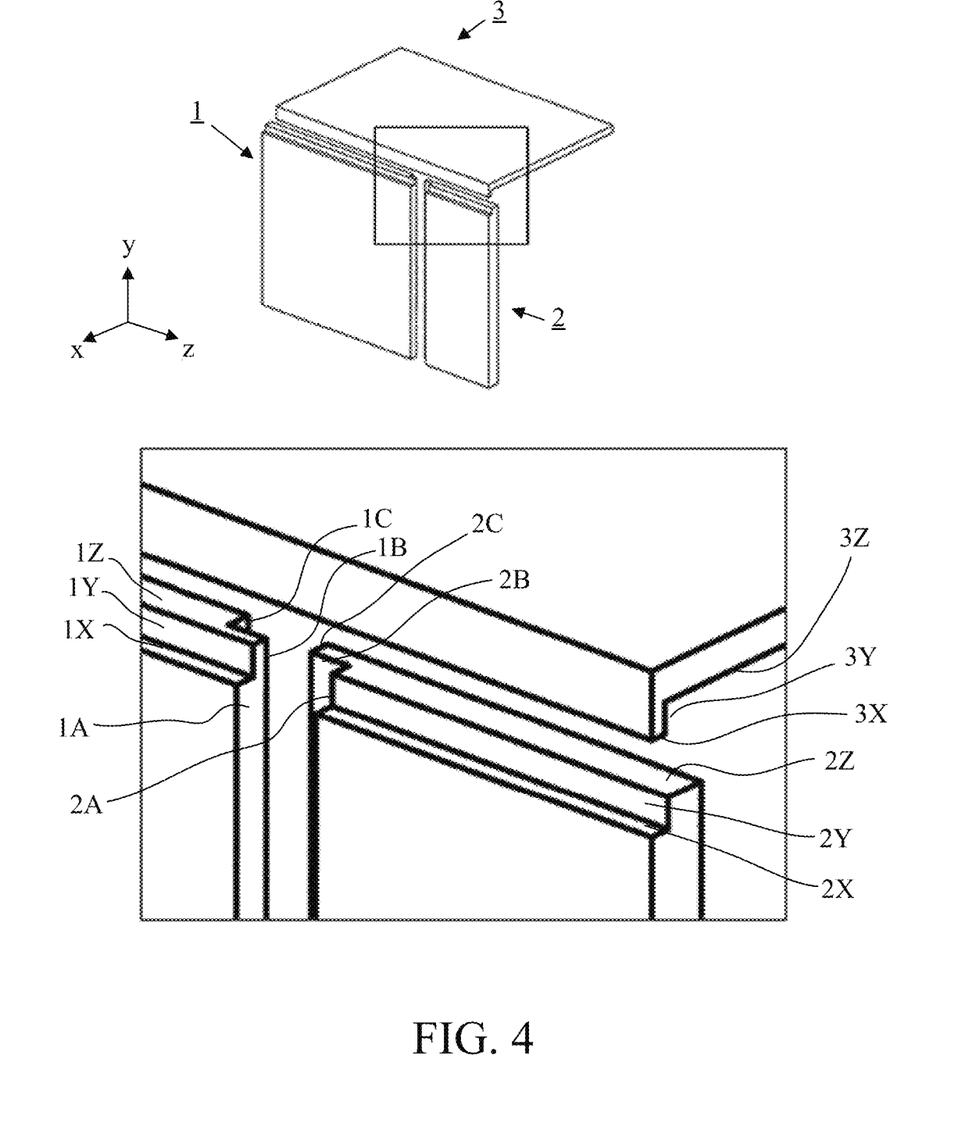
FIG. 4 is an exploded perspective view and a partial enlarged view illustrating the body frame model according to a first embodiment.
Figure 5:
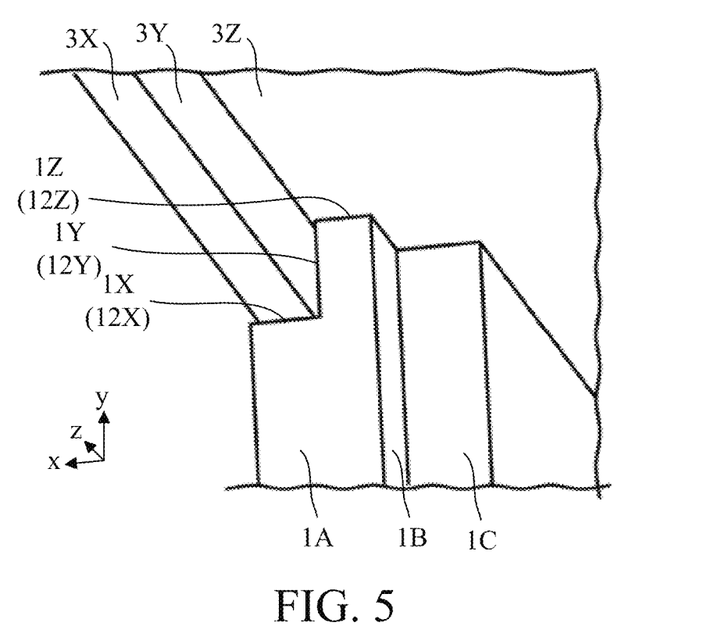
FIG. 5 is a perspective view illustrating the body frame model (first and third members) according to the first embodiment.
Figure 6:
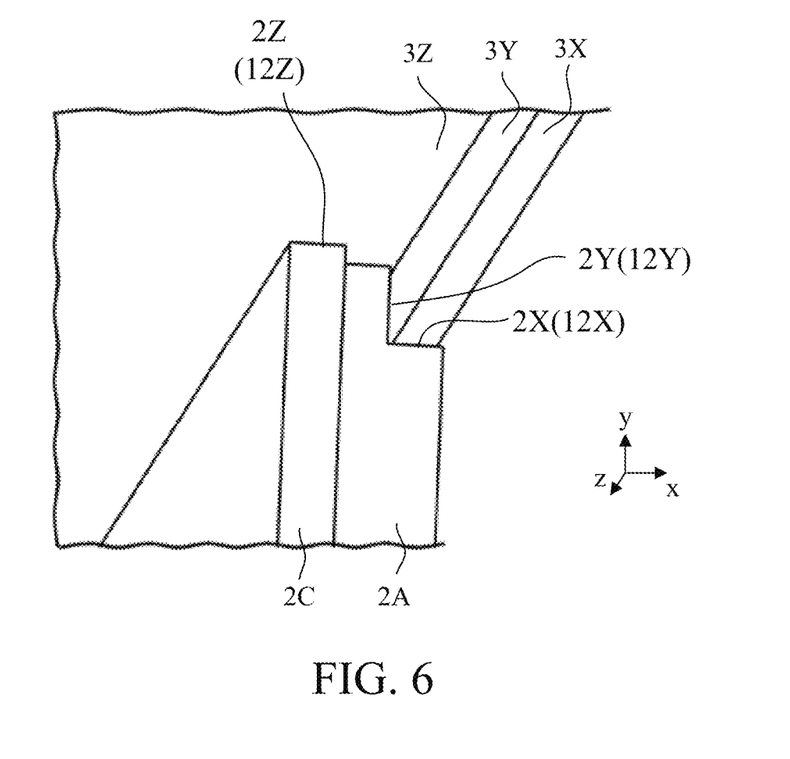
FIG. 6 is a perspective view illustrating the body frame model (second and third members) according to the first embodiment.

An upper drawing of FIG. 4 illustrates an exploded state of the first to third members 1 to 3, and a lower drawing of FIG. 4 is an enlarged view of a framed portion of the upper drawing. FIG. 5 illustrates the mating part of the first member 1 and the third member 3 as diagonally viewed from an inner side. In FIG. 5, an illustration of the second member 2 is omitted. FIG. 6 illustrates the mating part of the second member 2 and the third member 3 as diagonally viewed from the inner side. In FIG. 6, an illustration of the first member 1 is omitted. As illustrated in FIGS. 4 to 6, the mating surfaces 1A and 2A are orthogonally connected to the mating surfaces 1Z and 2Z. The mating surfaces 1B and 2B are not connected to the mating surfaces 1Y and 2Y, respectively.

Figure 7:
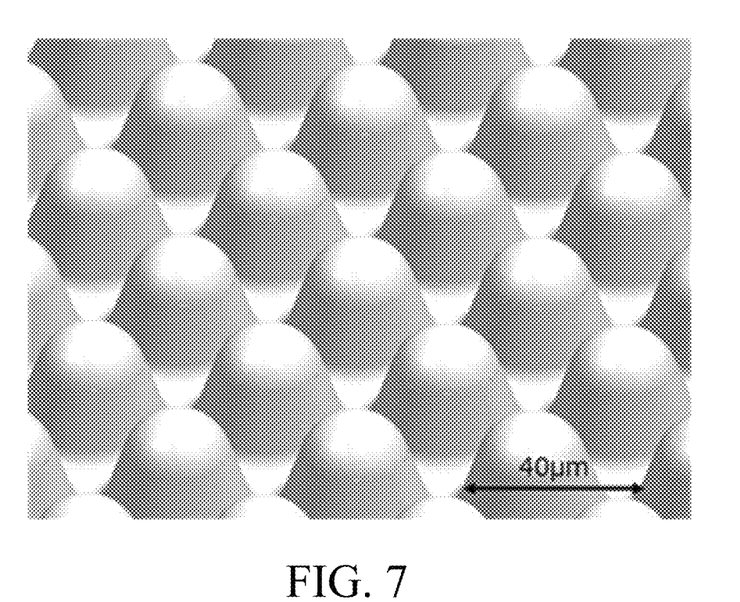
FIG. 7 is a diagram illustrating a surface having a microstructure according to the first embodiment.

FIG. 7 is an enlarged view of a surface of a resin component having a microstructure having a liquid repellency (water repellency). In this microstructure, many convex shapes are arranged at a pitch of 40 µm, and concave shapes are formed between the convex shapes. This microstructure is provided (that is, molded) by transferring, to a resin surface, a microscopic convex-concave shape formed by irradiation of a femtosecond laser on a surface of a resin molding mold. It has been known that a resin surface having such a microstructure has a larger contact angle with a droplet (water droplet) than a contact angle with a droplet of a resin surface having no microstructure and has a water-repellent effect. The microstructure may have any shape and pitch as long as a water-repellent effect can be acquired.

In this embodiment, a microstructure as illustrated in FIG. 7 is molded on at least one (one or both) of the mating surface 1A and the mating surface 2A, and thereby water-repellent processing is applied to the surface. Similar water-repellent processing is also applied to at least one of the mating surface 12X and the mating surface 3X. The mating surface to which the water-repellent processing is applied has a larger contact angle with a water droplet than a contact angle of a water droplet and a surface to which the water-repellent processing is not applied, and therefore it is possible to prevent water from intruding into an inside of the body frame 100 from the surface to which the water-repellent processing is applied.

In this embodiment, the first to third members 1 to 3 are manufactured by using molds in which the microstructure is formed as described above, and thereby molding of the first to third members 1 to 3 and application of the water-repellent processing to the mating surfaces are simultaneously performed. The other embodiments described below have the same process.

At least two of the first to third members 1 to 3 may be made of resin material with which the microstructure is easily transferred by using the mold so that the water-repellent processing is applied to at least one of the two mating surfaces facing each other. As a result, it becomes not necessary to fill the gaps between the mating surfaces with sealing members, which makes it possible to suppress an increase in the number of manufacturing processes of the body frame 100 and an increase in the size of the body frame 100 (that is, the image pickup apparatus). Further, forming the microstructure by the transfer from the mold can reduce the number of manufacturing processes and manufacturing costs as compared to a case where a liquid-repellent coating or the like is secondarily provided on the mating surfaces of the first to third members 1 to 3.

In a case where the water-repellent processing is applied to both the mating surfaces 12X and 3X facing each other, the microstructures on the mating surfaces may not have the same shape and pitch. For example, the mold for molding the first member 1 illustrated in FIG. 3C is opened (pulled out) in the x direction and the −x direction in the drawing, and the mold for molding the third member 3 is opened in the y direction and the −y direction. Since the mating surface 3X is a surface that is almost orthogonal to the opening direction of the mold, it is not difficult to form the microstructure even when the microstructure has a narrow pitch and a deep concave-convex shape. However, since the mating surface 1X is a surface that is almost parallel to the opening direction of the mold, it may be necessary to provide a substantial gradient on the mating surface 1X so that a microstructure equivalent to the microstructure of the mating surface 3X is formed on the mating surface 1X. An increase in the size of the body frame 100 caused by this may be avoided by, for example, making the pitch or shape of the microstructure formed on the mating surface 1X different from the pitch or shape of the microstructure of the mating surface 3X. Alternatively, the microstructure may be provided only in a partial area instead of the entire surface of the mating surface 1X.

There are other combinations of mating surfaces to which the water-repellent processing is applied, the combinations preventing water from intruding into the inside of the body frame 100. Specifically, in a case where the water-repellent processing is applied to at least one of the mating surfaces 1A and 2A, the water-repellent processing is applied to at least one of the mating surfaces 12Y and 3Y or to at least one of the mating surfaces 12Z and 3Z. In a case where the water-repellent processing is applied to at least one of the mating surfaces 1B and 2B, the water-repellent processing is applied to at least one of the mating surfaces 12Z and 3Z. In a case where the water-repellent processing is applied to at least one of the mating surfaces 1C and 2C, the water-repellent processing is applied to at least one of the mating surfaces 12Z and 3Z. Table 1 summarizes the combinations of the mating surfaces to which the water-repellent processing is applied and whether or not these combinations can prevent water intrusion (whether or not these combinations are waterproof). Water intrusion paths 101 and 102 in the table are described below.

TABLE 1

|  | Water-Repellent Processing Applied to Mating Surfaces 12X and/or 3X | Water-Repellent Processing Applied to Mating Surfaces 12Y and/or 3Y | Water-Repellent Processing Applied to Mating Surfaces 12Z and/or 3Z |
|---|---|---|---|
| Water-Repellent Processing Applied to Mating Surfaces 1A and/or 2A | Waterproof | Waterproof | Waterproof |
| Water-Repellent Processing Applied to Mating Surfaces 1B and/or 2B | Water Intrusion (Path 101) | Water Intrusion (Path 101) | Waterproof(*) |
| Water-Repellent Processing Applied to Mating Surfaces 1C and/or 2C | Water Intrusion (Path 102) | Water Intrusion (Path 102) | Waterproof |

Figure 8:
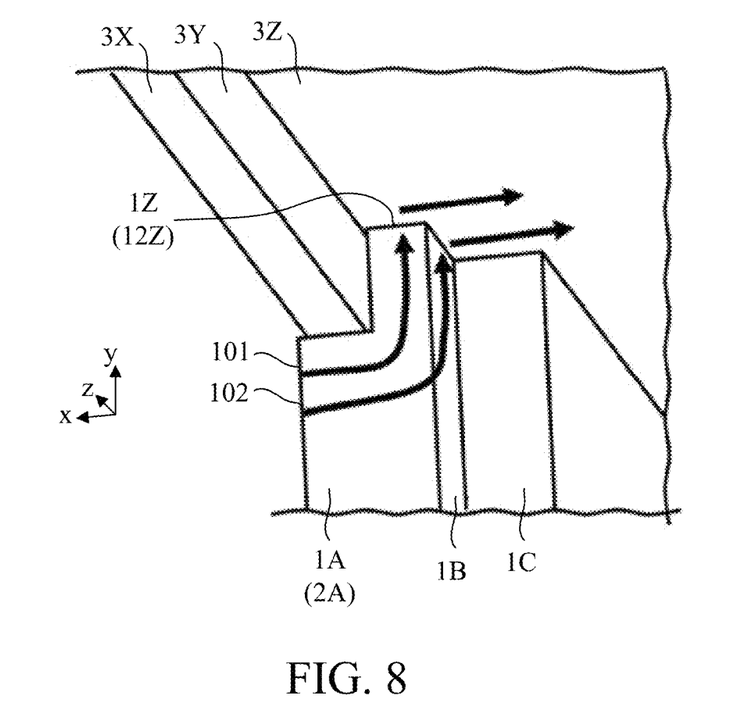
FIG. 8 is a diagram illustrating water intrusion paths of the body frame model according to the first embodiment.

FIG. 8 illustrates the water intrusion paths 101 and 102 in the mating part of the first member 1 and the third member 3. In FIG. 8, an illustration of the second member 2 is omitted. In the water intrusion path 101, water droplets that have intruded from between the mating surfaces 1A and 2A reach the mating surfaces 3Z and 12Z and intrude into the inside of the body frame 100 from between the mating surfaces 3Z and 12Z. In the water intrusion path 102, water droplets that have intruded from between the mating surfaces 1A and 2A reach the mating surfaces 3Z and 12Z through between the mating surfaces 1B and 2B and intrude into the inside of the body frame 100 from between the mating surfaces 3Z and 12Z.

If these water intrusion paths 101 and 102 are prevented from forming by selecting at least one of the combinations of the mating surfaces indicated to be "waterproof" in Table 1 and applying the water-repellent processing to the mating surfaces, it is possible to prevent water from intruding into the inside of the body frame 100. That is, it is possible to provide an image pickup apparatus having the body frame 100 having good waterproof (drip-proof) performance. At this time, the water-repellent processing may be applied to the mating surfaces of another combination.

Figure 9:
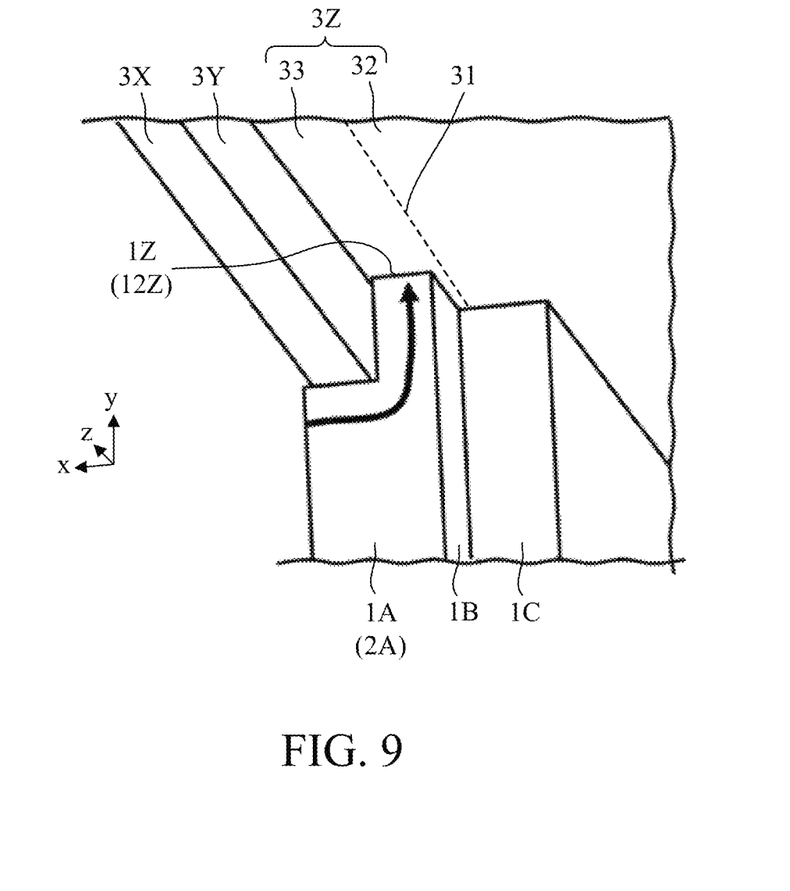
FIG. 9 is another perspective view illustrating the body frame model according to the first embodiment.

FIG. 9 illustrates a water intrusion path in the mating part of the first member 1 and the third member 3 in a case of the combination marked with * in Table 1. Here, a case will be described where the water-repellent processing is applied only to the mating surface 3Z among the mating surfaces 12Z and 3Z. In FIG. 9, an illustration of the second member 2 is omitted.

In this water intrusion path, water droplets that have intruded from between the mating surfaces 1A and 2A reach the mating surfaces 3Z and 12Z. The mating surface 3Z has a boundary line 31 that is a line extending in the z direction on the inner side of a position where the mating surfaces 1A and 2A are close to each other in the y direction. On the mating surface 3Z, the water-repellent processing is applied only to an area (second area) 32 existing on the inner side of the boundary line 31 and is not applied to an area (first area) 33 existing on the outer side of the boundary line 31 (i.e., the area 33 is more hydrophilic than the area 32). The reasons thereof are described below.

In a case where the water-repellent processing is applied to the entire surface of the mating surface 3Z, if a large number of water droplets that have intruded from between the mating surface 1A and 2A flow into the area to which the water-repellent processing is applied, it is difficult for the mating surface 3Z to stop the water droplets intruding into the inner side, and the water may intrude into the inside of the body frame 100. In a case where the mating surface 3Z is divided at the boundary line 31 into the area 32 to which the water-repellent processing is applied and the area 33 to which the water-repellent processing is not applied, the water droplets that have intruded from between the mating surfaces 1A and 2A first reach the area 33 to which the water-repellent processing is not applied of the mating surface 3Z. The contact angle greatly changes when the water droplets move from the area 33 toward the area 32 to which the water-repellent processing is applied, and therefore it is possible to prevent water intrusion into the inside of the body frame 100.

The case where the water-repellent processing is applied to the mating surface 3Z is described above. In a case where the water-repellent processing is applied to the mating surface 12Z, water intrusion into the inside of the body frame 100 can be similarly prevented by applying the water-repellent processing only to an area on the inner side of the boundary line 31. Further, the combination is not limited to the combination of the mating surfaces 3Z and 12Z, and by applying this to a combination of mating surfaces having a similar relationship, it is possible to prevent water intrusion into the inside of the body frame 100.

Second Embodiment

Figure 10:
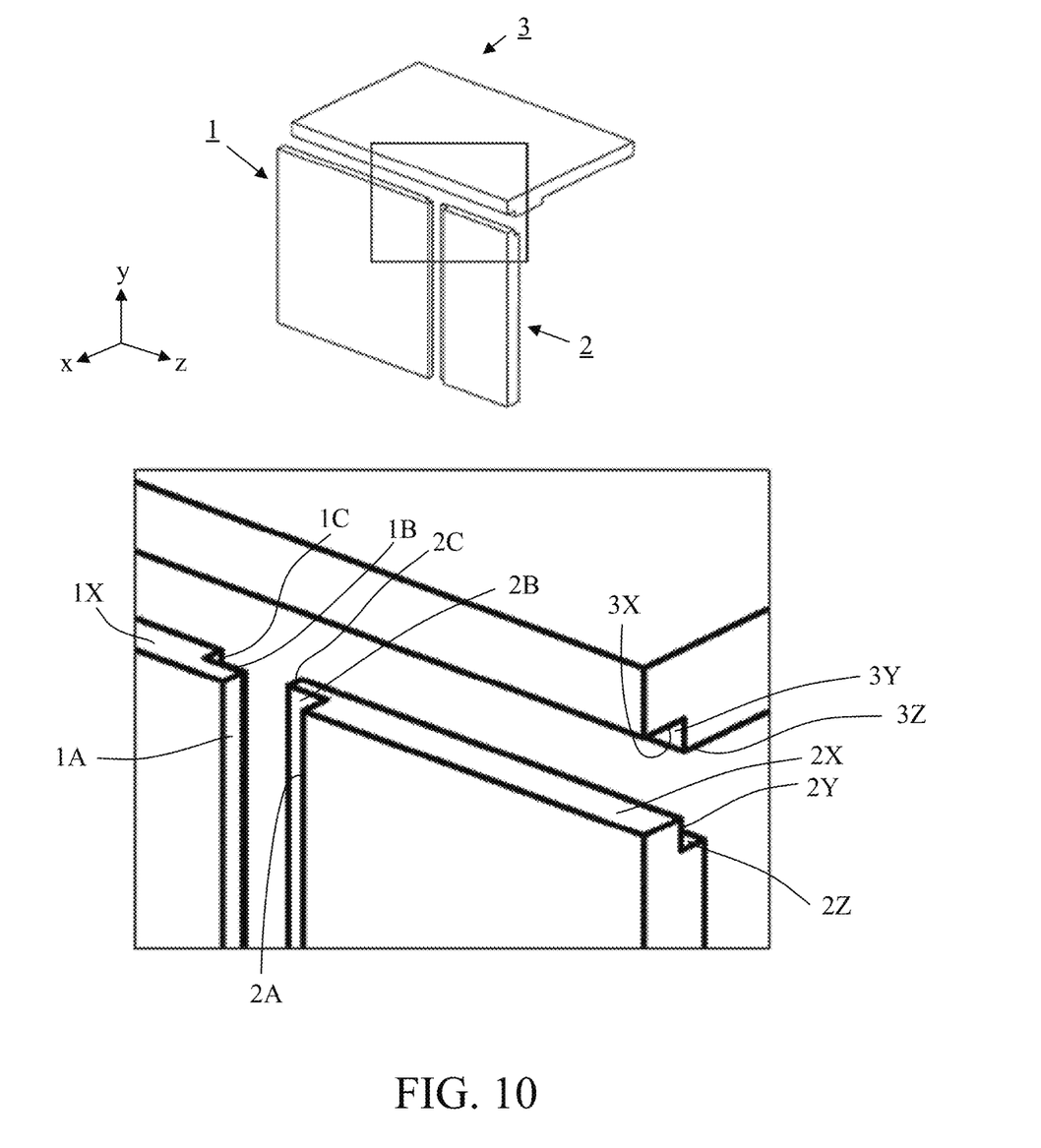
FIG. 10 is an exploded perspective view and a partial enlarged view illustrating a body frame model according to a second embodiment.
Figure 11:
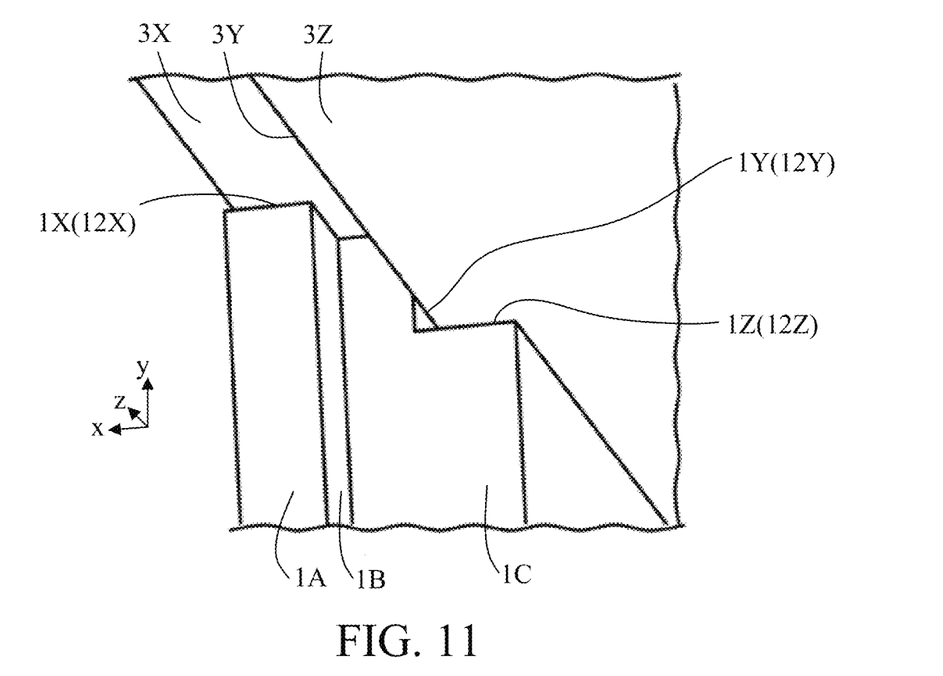
FIG. 11 is a perspective view illustrating the body frame model (first and third members) according to the second embodiment.
Figure 12:
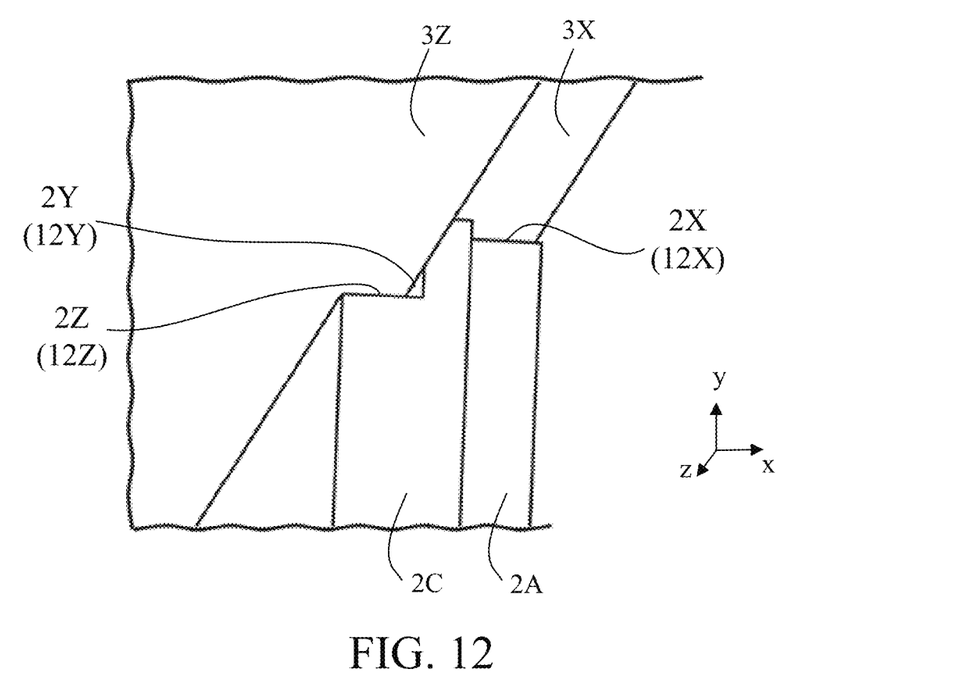
FIG. 12 is a perspective view illustrating the body frame model (second and third members) according to the second embodiment.

Next, a second embodiment of the present disclosure is described below. An upper drawing of FIG. 10 is an exploded view of first to third members 1 to 3 according to this embodiment, and a lower drawing of FIG. 10 is an enlarged view of a framed portion of the upper drawing. FIG. 11 illustrates a mating part of the first member 1 and the third member 3 as diagonally viewed from an inner side. In FIG. 11, an illustration of the second member 2 is omitted. FIG. 12 illustrates a mating part of the second member 2 and the third member 3 as diagonally viewed from the inner side. In FIG. 12, an illustration of the first member 1 is omitted. As illustrated in FIGS. 10 to 12, mating surfaces 1A and 2A are connected to mating surfaces 1X and 2X, respectively, and are not connected to mating surfaces 1Y and 2Y and mating surfaces 1Z and 2Z, respectively. Mating surfaces 1B and 2B are not connected to the mating surfaces 1Y and 2Y, respectively.

In this embodiment, combinations of mating surfaces to which water-repellent processing is applied to prevent water from intruding into the inside of the body frame 100 are as follows. In a case where the water-repellent processing is applied to at least one of the mating surfaces 1A and 2A, the water-repellent processing is applied to at least one of mating surfaces 12X and 3X. In a case where the water-repellent processing is applied to at least one of the mating surfaces 1B and 2B, the water-repellent processing is applied to at least one of the mating surfaces 12X and 3X. In a case where the water-repellent processing is applied to at least one of mating surfaces 1C and 2C, the water-repellent processing is applied to at least one of the mating surfaces 12X and 3X, at least one of mating surfaces 12Y and 3Y, or at least one of mating surfaces 12Z and 3Z. Table 2 summarizes the combinations of the mating surfaces to which the water-repellent processing is applied and whether or not these combinations can prevent water intrusion (whether or not these combinations are waterproof). Water intrusion paths 201 and 202 in the table are described below.

TABLE 2

|  | Water-Repellent Processing Applied to Mating Surfaces 12X and/or 3X | Water-Repellent Processing Applied to Mating Surfaces 12Y and/or 3Y | Water-Repellent Processing Applied to Mating Surfaces 12Z and/or 3Z |
| --- | --- | --- | --- |
| Water-Repellent Processing Applied to Mating Surfaces 1A and/or 2A | Waterproof | Water Intrusion (Path 201) | Water Intrusion (Path 201) |
| Water-Repellent Processing Applied to Mating Surfaces 1B and/or 2B | Waterproof | Water Intrusion (Path 202) | Water Intrusion (Path 202) |
| Water-Repellent Processing Applied to Mating Surfaces 1C and/or 2C | Waterproof | Waterproof | Waterproof |

Figure 13:
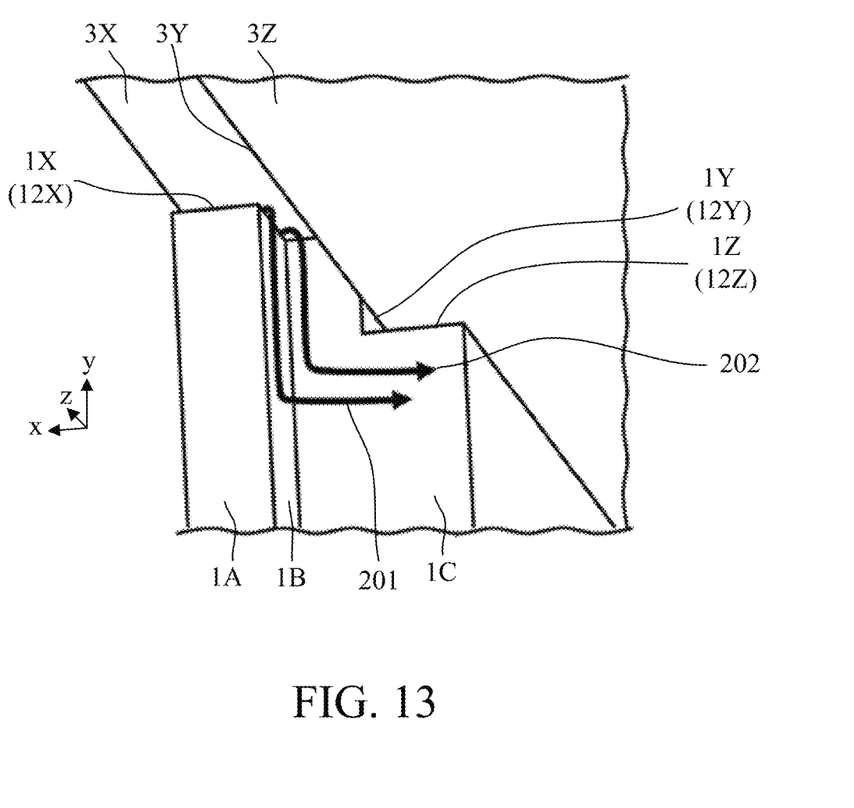
FIG. 13 is a diagram illustrating water intrusion paths of the body frame model according to the second embodiment.

FIG. 13 illustrates the water intrusion paths 201 and 202 in the mating part of the first member 1 and the third member 3. In FIG. 13, an illustration of the second member 2 is omitted. In the water intrusion path 201, water droplets that have intruded from between the mating surfaces 12X and 3X reach the mating surfaces 1C and 2C through between the mating surfaces 1B and 2B, and intrude into the inside of the body frame 100 from between the mating surfaces 1C and 2C. In the water intrusion path 202, water droplets that have intruded from between the mating surfaces 12X and 3X reach the mating surfaces 1C and 2C, and intrude into the inside of the body frame 100 from between the mating surfaces 1C and 2C.

If these water intrusion paths 201 and 202 are prevented from forming by selecting at least one of the combinations of the mating surfaces indicated to be "waterproof" in Table 2 and applying the water-repellent processing to the mating surfaces, it is possible to prevent water from intruding into the inside of the body frame 100. That is, it is possible to provide an image pickup apparatus having the body frame 100 having good waterproof performance. At this time, the water-repellent processing may be applied to the mating surfaces of another combination.

Third Embodiment

Figure 14:
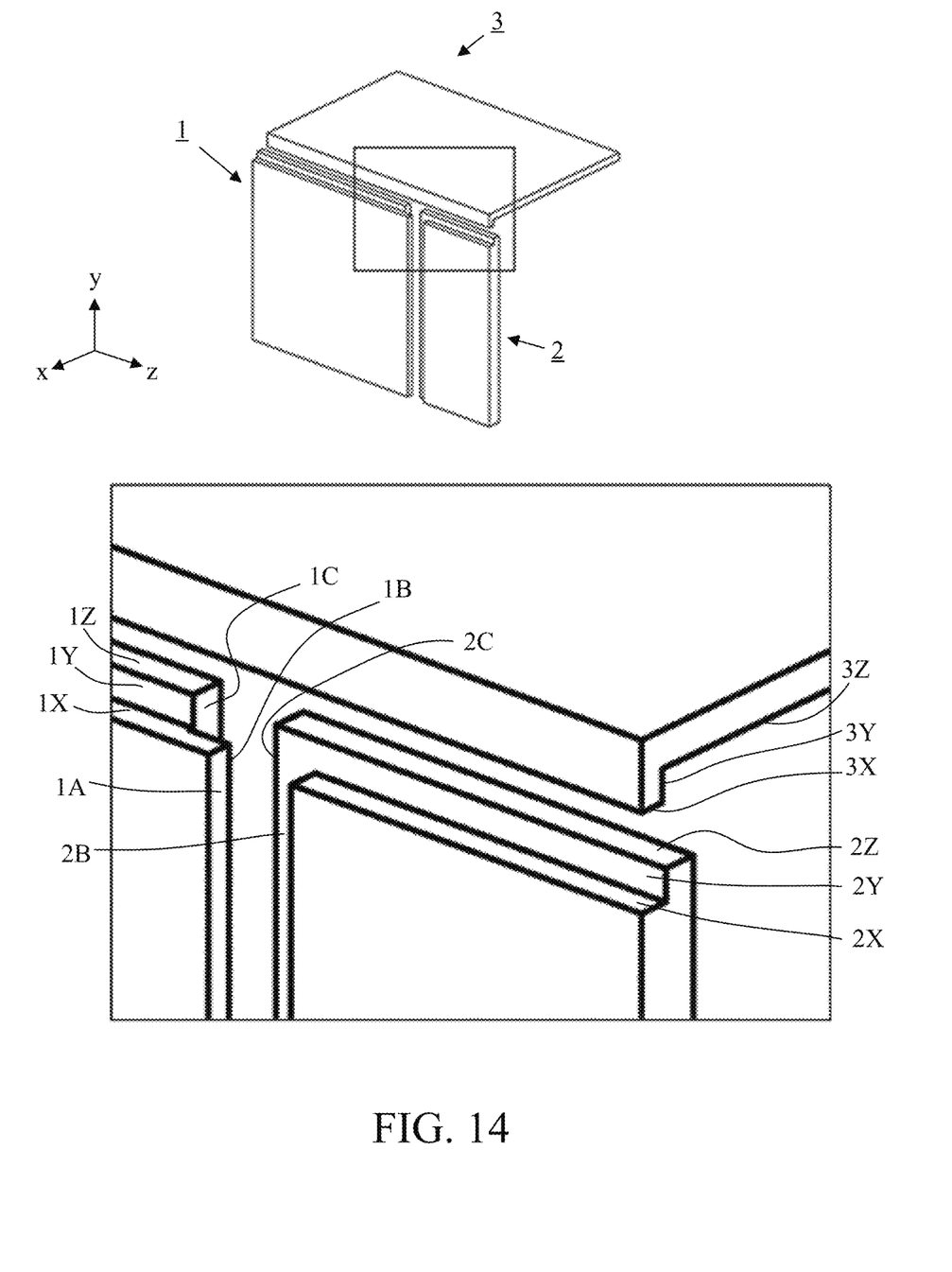
FIG. 14 is an exploded perspective view and a partial enlarged view illustrating a body frame model according to a third embodiment.
Figure 15:
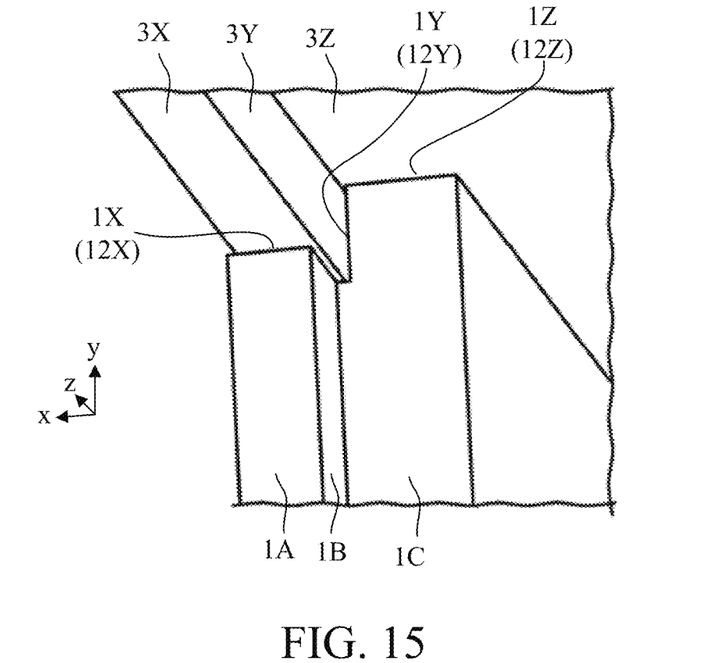
FIG. 15 is a perspective view illustrating the body frame model (first and third members) according to the third embodiment.
Figure 16:
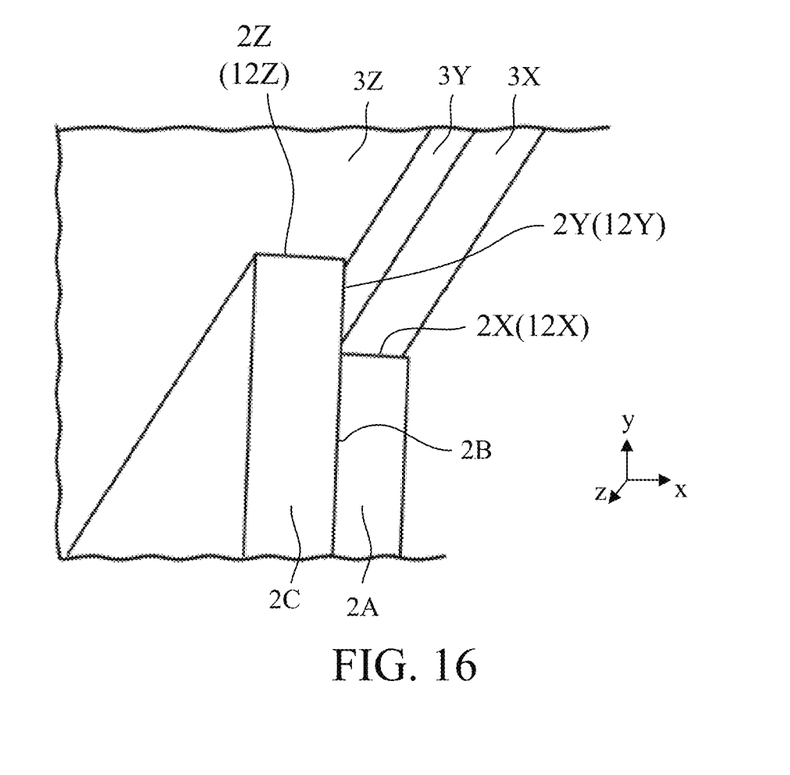
FIG. 16 is a perspective view illustrating the body frame model (second and third members) according to the third embodiment.

Next, a third embodiment of the present disclosure is described below. An upper drawing of FIG. 14 is an exploded view of first to third members 1 to 3 according to this embodiment, and a lower drawing of FIG. 14 is an enlarged view of a framed portion of the upper drawing. FIG. 15 illustrates a mating part of the first member 1 and the third member 3 as diagonally viewed from an inner side. In FIG. 15, an illustration of the second member 2 is omitted. FIG. 16 illustrating a mating part of the second member 2 and the third member 3 as diagonally viewed from the inner side. In FIG. 16, an illustration of the first member 1 is omitted. In this embodiment, as illustrated in FIGS. 14 to 16, a mating surface 2B and a mating surface 2Y are continuous surfaces. Instead of the mating surface 2B and the mating surface 2Y, a mating surface 1B and a mating surface 1Y may be continuous surfaces.

In this embodiment, combinations of mating surfaces to which water-repellent processing is applied to prevent water from intruding into the inside of the body frame 100 are as follows. In a case where the water-repellent processing is applied to at least one of mating surfaces 1A and 2A, the water-repellent processing is applied to at least one of mating surfaces 12X and 3X. In a case where the water-repellent processing is applied to at least one of mating surfaces 1C and 2C, the water-repellent processing is applied to at least one of mating surfaces 12Y and 3Y or at least one of mating surfaces 12Z and 3Z. Table 3 summarizes the combinations of the mating surfaces to which the water-repellent processing is applied and whether or not these combinations can prevent water intrusion (whether or not these combinations are waterproof). Water intrusion paths 301, 302, and 303 in the table are described below.

Figure 17:
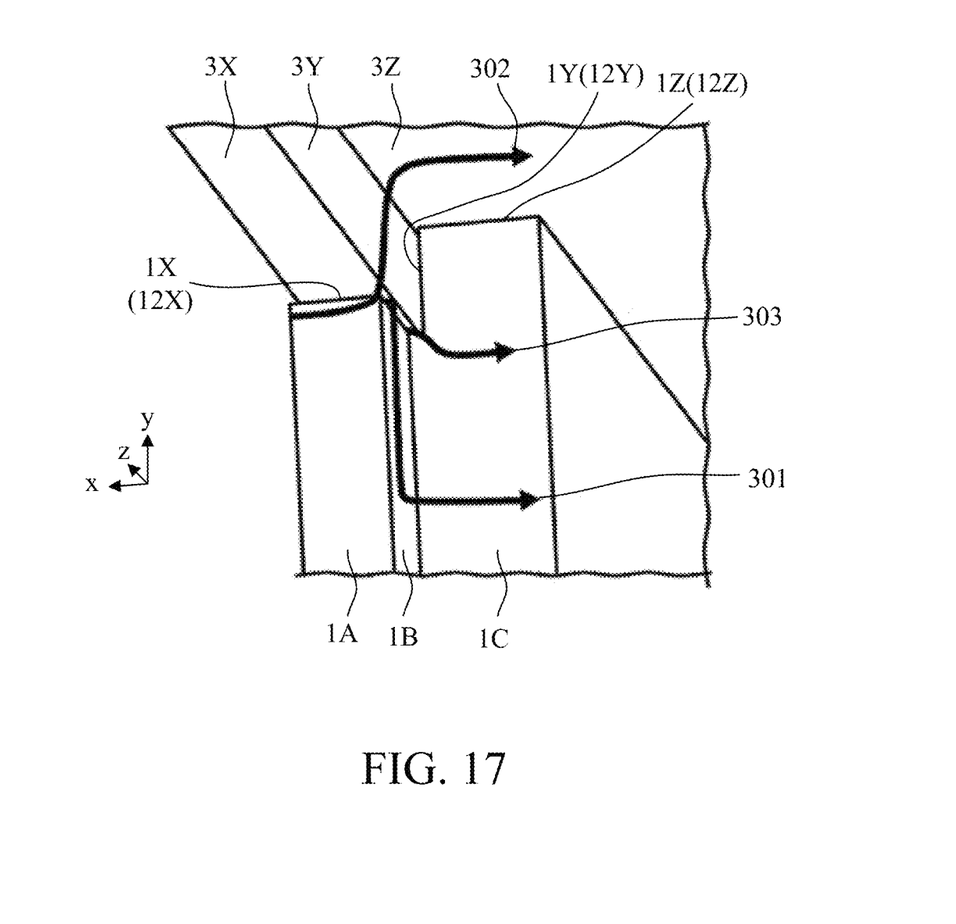
FIG. 17 is a diagram illustrating water intrusion paths of the body frame model according to the third embodiment.

FIG. 17 illustrates the water intrusion paths 301 to 303 in the mating part of the first member 1 and the third member 3. In FIG. 17, an illustration of the second member 2 is omitted. In the water intrusion path 301, water droplets that have intruded from between the mating surfaces 12X and 3X reach the mating surfaces 1C and 2C through between the mating surfaces 1B and 2B, and intrude into the inside of the body frame 100 from between the mating surfaces 1C and 2C. In the water intrusion path 302, the water droplets that have intruded from between the mating surfaces 1A and 2A reach the mating surfaces 3Z and 12Z through between the mating surfaces 3Y and 12Y, and intrude into the inside of the body frame 100 from between the mating surfaces 3Z and 12Z. In the water intrusion path 303, water droplets that have intruded from between the mating surfaces 12X and 3X reach the mating surfaces 1C and 2C, and intrude into the inside of the body frame 100 from between the mating surfaces 1C and 2C.

If these water intrusion paths 301 to 303 are prevented from forming by selecting at least one of the combinations of the mating surfaces indicated to be "waterproof" in Table 3 and applying the water-repellent processing to the mating surfaces, it is possible to prevent water from intruding into the inside of the body frame 100. At this time, the water-repellent processing may be applied to the mating surfaces of another combination.

According to each embodiment described above, it is possible to ensure the waterproof performance in the mating parts of the three members 1 to 3 included in the body frame 100 with costs reduced and a space saved. In a case where exterior surface processing such as a coating and textural processing is applied to the exterior surface of each member, it may be difficult to provide the microstructures as the water-repellent processing on the mating surfaces (1A, 2A, 1X, 2X, and 3X) connected to the exterior surfaces. Even in this case, water intrusion into the inside of the body frame 100 can be prevented by providing the microstructure on the other proper combination of the mating surfaces. That is, it is possible to provide an image pickup apparatus including a body frame 100 having good waterproof performance.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

TABLE 3

|  | Water-Repellent Processing Applied to Mating Surfaces 12X and/or 3X | Water-Repellent Processing Applied to Mating Surfaces 12Y and/or 3Y | Water-Repellent Processing Applied to Mating Surfaces 12Z and/or 3Z |
| --- | --- | --- | --- |
| Water-Repellent Processing Applied to Mating Surfaces 1A and/or 2A | Waterproof | Water Intrusion (Path 301) | Water Intrusion (Path 301) |
| Water-Repellent Processing Applied to Mating Surfaces 1B and/or 2B | Water Intrusion (Path 302) | Water Intrusion (Path 303) | Water Intrusion (Path 303) |
| Water-Repellent Processing Applied to Mating Surfaces 1C and/or 2C | Water Intrusion (Path 302) | Waterproof | Waterproof |

This application claims the benefit of Japanese Patent Application No. 2021-071654, filed on Apr. 21, 2021, which is hereby incorporated by reference herein in its entirety.

What is claimed is:

1. An electronic device comprising a body frame formed by mating a first member, a second member, and a third member, wherein each of the first and second members includes: a first mating surface and a second mating surface one of which is provided on an outer surface side and the other of which is provided on an inner surface side, the first and second mating surfaces being stepped surfaces; and a third mating surface connected to the first and second mating surfaces, wherein the first and second members are mated to each other so that the first mating surfaces face each other in a first direction, the second mating surfaces face each other in the first direction, and the third mating surfaces face each other in a second direction orthogonal to the first direction, wherein each of the first, second, and third members includes: a fourth mating surface and a fifth mating surface one of which is provided on the outer surface side and the other of which is provided on the inner surface side, the fourth and fifth mating surfaces being stepped surfaces; and a sixth mating surface connected to the fourth and fifth mating surfaces, wherein the first and third members and the second and third members are respectively mated to each other so that the fourth mating surfaces face each other in a third direction orthogonal to the first and second directions, the fifth mating surfaces face each other in the third direction, and the sixth mating surfaces face each other in the second direction, and wherein a microstructure is provided on each of (a) at least one mating surface of the first, second, and third mating surfaces of at least one member of the first and second members and (b) at least one mating surface of the fourth, fifth, and sixth mating surfaces of at least one member of the first, second, and third members, the microstructure being molded so that a surface provided with the microstructure has a liquid repellency.

2. The electronic device according to claim 1, wherein in each of the first and second members, the first mating surface is connected to the fifth mating surface, and the third mating surface is not connected to the sixth mating surface, and
wherein a combination of mating surfaces each provided with the microstructure includes at least one of:
a combination of (a) the first mating surface of at least one member of the first and second members and (b) the fourth, fifth, or sixth mating surface of at least one member of the first to third members; and
a combination of (a) the second or third mating surface of at least one member of the first and second members and (b) the fifth mating surface of at least one member of the first to third members.

3. The electronic device according to claim 1, wherein in each of the first and second members, the first mating surface is connected to the fourth mating surface and is not connected to the fifth and sixth mating surfaces, and the third mating surface is not connected to the sixth mating surface, and
wherein a combination of mating surfaces each provided with the microstructure includes at least one of:
a combination of (a) the first or third mating surface of at least one member of the first and second members and (b) the fourth mating surface of at least one member of the first to third members; and
a combination of (a) the second mating surface of at least one member of the first and second members and (b) the fourth, fifth, or sixth mating surface of at least one member of the first to third members.

4. The electronic device according to claim 1, wherein in one of the first and second members, the third mating surface and the sixth mating surface are continuous, and
wherein a combination of mating surfaces each provided with the microstructure includes at least one of:
a combination of (a) the first mating surface of at least one member of the first and second members and (b) the fourth mating surface of at least one member of the first to third members; and
a combination of (a) the second mating surface of at least one member of the first and second members and (b) the fifth or sixth mating surface of at least one member of the first to third members.

5. The electronic device according to claim 1, wherein the microstructure is not provided on a first area of a mating surface of one member of the first to third members, the first area being close to a position where mating surfaces of the other two members face each other, and
wherein the microstructure is provided on a second area located on an inner side of the first area.

6. The electronic device according to claim 1, wherein exterior surface processing is applied to outer surfaces of the first to third members.

7. The electronic device according to claim 1, wherein the microstructure is a structure transferred from a mold for forming a member provided with the microstructure among the first to third members.

8. The electronic device according to claim 7, wherein a shape, a pitch, or an area of the microstructure is different between a mating surface parallel to an opening direction of the mold and a mating surface orthogonal to the opening direction, the mating surfaces being any of the first to sixth mating surfaces.

* * * * *